United States Patent
Crandall et al.

(10) Patent No.: US 8,010,473 B2
(45) Date of Patent: *Aug. 30, 2011

(54) PRIME INDEXING AND/OR OTHER RELATED OPERATIONS

(75) Inventors: Richard Crandall, Portland, OR (US); Sam Noble, Portland, OR (US)

(73) Assignee: Robert T. and Virginia T. Jenkins, Sacramento, CA (US), as Trustees of the Jenkins Family Trust Dated Feb. 8, 2002

( * ) Notice: Subject to any disclaimer, the term of this patent is extended or adjusted under 35 U.S.C. 154(b) by 0 days.

This patent is subject to a terminal disclaimer.

(21) Appl. No.: 12/613,481

(22) Filed: Nov. 5, 2009

(65) Prior Publication Data

US 2010/0114845 A1   May 6, 2010

Related U.S. Application Data (63) Continuation of application No. 11/511,611, filed on Aug. 28, 2006, now Pat. No. 7,711,666.

(60) Provisional application No. 60/713,576, filed on Aug. 31, 2005.

(51) Int. Cl.
G06F 15/00 (2006.01)
G06F 17/00 (2006.01)

(52) U.S. Cl. .......................... 706/45; 706/62
(58) Field of Classification Search ............. 706/45
See application file for complete search history.

(56) References Cited

U.S. PATENT DOCUMENTS

| | | | |
|---|---|---|---|
| 5,724,576 A | 3/1998 | LeTourneau | |
| 5,758,152 A | 5/1998 | LeTourneau | |
| 5,787,432 A | 7/1998 | LeTourneau | |
| 6,055,537 A | 4/2000 | LeTourneau | |
| 6,330,332 B1 | 12/2001 | Itoh et al. | |
| 6,529,929 B2 | 3/2003 | Hong | |
| 6,845,482 B2 | 1/2005 | Yao et al. | |
| 6,919,826 B1 | 7/2005 | Peacock | |
| 7,711,666 B1 | 5/2010 | Crandall | |
| 2002/0178353 A1 | 11/2002 | Graham | |
| 2003/0065925 A1 | 4/2003 | Shindo et al. | |
| 2003/0076954 A1 | 4/2003 | Vanstone et al. | |
| 2004/0047470 A1 | 3/2004 | Candelore | |
| 2005/0156770 A1 | 7/2005 | Melanson | |
| 2006/0294136 A1 | 12/2006 | Wu | |
| 2007/0147603 A1 | 6/2007 | Nakano et al. | |

OTHER PUBLICATIONS

Crandall et al., "Prime Numbers: A Computational Perspective", Springer ISBN 0-387-94777-9, www.springer-ny.com, 2001, pp. 1-547.*

Crandall et al., "Prime Numbers: A Computational Perspective", Springer ISBN 0-387-94777-9, www.springer-ny.com, 2001, Part 1, 1-263 pages.

Crandall et al., "Prime Numbers: A Computational Perspective", Springer ISBN 0-387-94777-9, www.springer-ny.com, 2001, Part 2, 264-547 pages.

Non-final Office Action mailed Sep. 30, 2008, in U.S. Appl. No. 11/511,611, 10 pages.

(Continued)

*Primary Examiner* — Jeffrey A. Gaffin
*Assistant Examiner* — Nathan H Brown, Jr.
(74) *Attorney, Agent, or Firm* — Berkeley Law & Technology Group, LLP (57) ABSTRACT

Embodiments of prime indexing and/or other related operations are disclosed. prime indexing and/or other related operations are disclosed.

70 Claims, 5 Drawing Sheets

OTHER PUBLICATIONS

Response filed Dec. 30, 2008 in U.S. Appl. No. 11/511,611, 22 pages.
Final Office action mailed Mar. 17, 2009 in U.S. Appl. No. 11/511,611, 13 pages.
Amendment After Final filed May 22, 2009 in U.S. Appl. No. 11/511,611, 27 pages.
Advisory action mailed Jun. 15, 2009 in U.S. Appl. No. 11/511,611, 4 pages.
Request for Continued Examination and Amendment filed Jul. 17, 2009 in U.S. Appl. No. 11/511,611, 20 pages.
Examiner's Interview Summary mailed Jul. 27, 2009 in U.S. Appl. No. 11/511,611, 2 pages.
Notice of Allowance and Examiner's Amendment mailed Sep. 3, 2009 in U.S. Appl. No. 11/511,611, 10 pages.
Request for Continued Examination filed Nov. 13, 2009 in U.S. Appl. No. 11/511,611, 3 pages.
Notice of Allowance and Examiner's Amendment mailed Dec. 22, 2009 in U.S. Appl. No. 11/511,611, 10 pages.
Patent Application filed Jun. 1, 2006 in U.S. Appl. No. 11/446,452, 96 pages.
Preliminary Admendment filed Nov. 17, 2006 in U.S. Appl. No. 11/446,452, 3 pages.
Office Action mailed Aug. 14, 2009 in U.S. Appl. No. 11/446,252, 51 pages.
Response filed Dec. 14, 2009 in U.S. Appl. No. 11/446,452, 76 pages.
U.S. Appl. No. 11/511,611 Application as filed on Aug. 28, 2006, 32 pages.
U.S. Appl. No. 11/511,611 Notice to File Missing Parts mailed on Sep. 19, 2006, 2 pages.
U.S. Appl. No. 11/511,611 Response to Notice to File Missing Parts as filed on Jan. 31, 2007, 13 pages.
U.S. Appl. No. 11/511,611 Filing Receipt mailed on Feb. 6, 2007, 3 pages.
U.S. Appl. No. 11/511,611 Request for Continued Examination as filed on Nov. 13, 2009, 9 pages.
U.S. Appl. No. 11/511,611 Issue Fee Payment, mailed Mar. 18, 2010, 6 pages.
U.S. Appl. No. 11/511,611 Issue Notification, mailed Apr. 14, 2010, 1 page.
U.S. Appl. No. 11/446,452 Notice to File Missing Parts, mailed Jul. 10, 2006, 2 pages.
U.S. Appl. No. 11/446,452 Response to Notice of Missing Parts, mailed Jan. 9, 2007, 17 pages.
U.S. Appl. No. 11/446,452 Filing Receipt, mailed Jan. 12, 2007, 3 pages.
U.S. Appl. No. 11/446,452 Notice of Informal Application, mailed Jan. 13. 2007, 1 page.
U.S. Appl. No. 11/446,452 Dod Secrecy Order Recommendation, as filed Feb. 1, 2007, 1 page.
U.S. Appl. No. 11/446,452 Final Office Action, mailed Mar. 16, 2010, 67 pages.
U.S. Appl. No. 11/446,452 Amendment After Final Office Action, mailed May 17, 2010, 60 pages.
U.S. Appl. No. 11/446,452 Amendment After Final Office Action Response, mailed May 21, 2010, 6 pages.
U.S. Appl. No. 11/446,452 Request for Continued Examination, mailed Jun. 16, 2010, 64 pages.

* cited by examiner

The difference $\pi(x) - Ri(x)$ (vertical axis) vs. $x \leq 10^8$ (horizontal axis)

FIG. 1

The difference $\pi(x) - S(x)$ (vertical axis) vs. $x \leq 10^8$ (horizontal axis)

650 — FOR SELECTED PRIME INDEX VALUES, DETERMINING DIFFERENCES BETWEEN VALUES OF A CLOSED FORM NUMERICALLY DETERMINABLE FUNCTION AND VALUES OF THE NUMBER OF PRIME NUMERALS.

COMPRESSING SAID DIFFERENCES USING ENTROPY ENCODING OR A VARIANT OF ENTROPY ENCODING.

STORING SAID DIFFERENCES IN A TABLE OF DIFFERENCES.

FIG. 5

660 — DETERMINING AN INTERVAL BOUNDING A PRIMER NUMERAL OR INDEX

SIEVING THE INTERVAL BY APPLYING A ERATOSTHENES SIEVE TO COMPUTE A COUNT.

FIG. 6

670 — DETERMINING AN INTERVAL BOUNDING A PRIME NUMERAL OR INDEX VALUE.

SIEVING THE INTERVAL BY APPLYING A STORED TABLE OF DIVISION-RELATED RESIDUES TO COMPUTE A COUNT.

FIG. 7

DETERMINING AN INTERVAL BOUNDING A PRIME NUMERAL OR INDEX VALUE.

↓

SIEVING THE INTERVAL BY APPLYING A STORED TABLE OF DIVISOR RECIPROCALS.

FIG. 8

DETERMINING AN INTERVAL BOUNDING A PRIME NUMERAL OR INDEX VALUE.

↓

SIEVING THE INTERVAL BY APPLYING A SIEVING WHEEL TECHNIQUE TO COMPUTE A COUNT.

FIG. 9

OBTAINING A PRIME NUMERAL TO BE EVALUATED.

↓

PRIME NUMERAL LESS THAN $2^m$?

NO → STORE PRIME NUMERALS INCLUDING PRIME NUMERALS $2^{m/2}$ OR GREATER IN TABLE.

YES → STORE PRIME NUMERALS LESS THAN $2^{m/2}$ IN TABLE.

FIG. 10

PRIME INDEXING AND/OR OTHER RELATED OPERATIONS

RELATED APPLICATION

This application is a continuation of and claims the benefit of priority to U.S. patent application Ser. No. 11/511,611 filed Aug. 28, 2006 now U.S. Pat. No. 7,711,666, which claims the benefit of priority to U.S. Provisional Patent Application Ser. No. 60/713,576 filed Aug. 31, 2005, entitled PRIME INDEXING AND/OR OTHER RELATED OPERATIONS assigned to assignee of claimed subject matter.

BACKGROUND

This disclosure is related to prime indexing and/or other related operations.

Prime numerals may be useful in a variety of computations. Likewise, it may be convenient for computations involving prime numerals to have the ability to obtain a prime numeral from its index or to obtain its index from the prime numeral. However, for relatively large prime numerals, this may be difficult due at least in part to limits on storage and/or processor computational power. Thus, techniques to obtain a prime numeral from its index or to obtain its index from the prime numeral continue to be desirable

BRIEF DESCRIPTION OF THE DRAWINGS

Subject matter is particularly pointed out and distinctly claimed in the concluding portion of the specification. Claimed subject matter, however, both as to organization and method of operation, together with objects, features, and/or advantages thereof, may best be understood by reference of the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits or binary digital signals stored within a computing system, such as within a computer or computing system memory. These algorithmic descriptions and/or representations are techniques used by those of ordinary skill in the data processing arts to convey the substance of their work to others skilled in the art. An algorithm is here and generally considered to be a self-consistent sequence of operations and/or similar processing leading to a desired result, such as for a practical and/or useful application. The operations and/or processing may involve physical manipulations of physical quantities. Typically, although not necessarily, these quantities may take the form of electrical and/or magnetic signals capable of being stored, transferred, combined, compared and/or otherwise manipulated to implement claimed subject matter typically. It has proven convenient, at times, principally for reasons of common usage, to refer to these signals as bits, data, values, elements, symbols, characters, terms, numbers, numerals and/or the like. It should be understood, however, that all of these and/or similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer and/or a similar electronic computing device, that manipulates and/or transforms data represented as physical electronic and/or magnetic quantities and/or other physical quantities within the computing platform's processors, memories, registers, and/or other information storage, transmission, and/or display devices.

Prime numerals may be useful in a variety of computations. Furthermore, it may be convenient for computations involving prime numerals to have the ability to obtain a prime numeral from its index or to obtain its index from the prime numeral. However, for relatively large prime numerals, this may be difficult due at least in part to limits on storage and/or processor computational power. Thus, techniques to obtain a prime numeral from its index or to obtain its index from the prime numeral continue to be desirable.

We begin by adopting a nomenclature to conveniently describe the related technical issues. Here, p(n) refers to the n-th prime numeral, also denoted as $p_n$. Likewise, n(q) refers to, for prime numeral q, the inverse of p( ) such that p(n(q))=q. Likewise, n(q)=π(q) where π(x) is the number of prime numerals not exceeding x. To illustrate, the 25-th prime is 97. Thus, we have p(25)=97 and n(97)=25.

The computational problem of creating fast operations to provide p( ), n( ) is challenging in several ways. Prime numerals are in practice quite numerous, although relatively, the natural numerals have a low density of prime numerals. For example, π($2^{50}$) is approximately $3 \cdot 10^{13}$. Therefore, outright storage of prime numerals below $2^{50}$, for example, is currently impractical. Furthermore, outright computation of π(x) is also not practical. For example, π($10^{23}$) is not known precisely. To determine the known value of π($10^{22}$)=201467286689315906290 involved months of network computation. These issues suggest that creating fast indexing operations for prime numerals may involve a memory-speed trade-off, as described in more detail hereinafter.

Literal storage here refers to the storage of primes numerals q<=x in some explicit format. If fewer bits may be employed, it may be better from a usage of memory point of view. A few methods are as follows:

Method 1:

Simple disk listing of all primes q<=x; number of bits is approximately 1.4·x.

Method 2:

Storage in which "1" represents prime numerals and "0" represents composite numerals. For example, a sequence of bits may be stored and a prime numeral may be obtained from counting to the positions having a "1" bit. Thus, the number of bits is determined from assigning one bit for each integer up to x. Thus, the number of bits is approximately x.

Method 3:

Compression of a bit stream may be accomplished using entropy encoding, for example. This will employ fewer bits than the previous techniques. The number of bits for this technique is a complex expression related to entropy.

Method 4:

Difference encoding, e.g., p(n+1) minus p(n). This will employ a similar number of bits as Method 3.

Exhibiting these elementary storage methods demonstrates that explicit storage will become quickly unfeasible as the order of magnitude grows. Methods 3 and 4, which grow as order of x, involve storage of "a few bits per prime." However, as x becomes relatively large, feasible storage capacity is exceeded.

However, difference techniques may be useful in some circumstances. For example, it may be useful for prime numerals, $q<2^m$, if m is not too large. For example, the following is an embodiment of a process for fast p(n), n(q) operations for $q<2^{32}$ based at least in part on byte-storage of differences. This process embodiment employs about 1 byte of pre-storage per prime numeral stored.

1) Fix a k, say k=16, and pre-store literally every k-th prime numeral $q_{jk}$ as an explicit integer numeral.
2) Store, after each $q_{jk}>2$, the (k-1) the divided differences $(q_{jk+i+1}$ minus $q_{jk+1})/2$: i=0, ..., k-2}.
   A difference should fit into a byte for the assumed range.
3) An evaluation of p(n) may now proceed as follows:
   Locate in storage the prime p (k·floor [n/k]) and add the next n mod k stored differences, each times 2, to get p(n).
4) For the n(q) evaluation, locate in storage the largest r<=n with q(k·floor[n/r])<=q and again use subsequent stored differences to find the index of q.

The above process is, of course, just one of many possible variants in which memory may be reduced at the expense of more rapid computation and claimed subject matter is not limited in scope to this particular embodiment. In other words, in this embodiment, for example, a process is employed that includes some storage and some computation. Likewise, a variety of different factors may affect the trade-off and balance of these possibilities, such as, cost, speed, availability, etc.

For $n(q)<=2^{24}$ one may easily fit into modern RAM allotments both a prime table and an index table, filled at run-time based, in this particular example, on several megabytes of pre-storage. Of course, one may reduce or even avoid pre-storage and at run-time use an Eratosthenes sieve to create the RAM tables, such as by reducing pre-storage through various potential hybrid approaches. Of course, if pre-storage is available, a sieve may be by-passed, if desired.

Next, we investigate a method for much larger ranges, and show how to get below 1 bit per prime, with some pre-storage, in this particular embodiment. A more precise form of the Prime Number Theorem (PNT) is given by the relationship:

$$\pi(x) \sim Li(x) = \int_2^x du/\ln u$$

in which the logarithmic integral Li may be calculated rapidly in comparison with π(x). The error in this approximation is very roughly $x^{1/2}$ ln x, and so Li evaluation essentially "knocks out" or saves about half the bits in π(x). But there is a better approximation, involving the Riemann function, is indicated by the following relationship:

$$Ri(x) = \sum_{n=1}^{\infty} \frac{\mu(n)}{n} Li(x^{1/n}) \quad [1]$$

in which μ is the Moebius function. Whereas π(x) is difficult to calculate rapidly, the Ri function is not. For example, there is a series indicated as follows:

$$Li(x^{1/n}) - Li(0) = \gamma + \ln\ln x - \ln n + \sum_{k=1}^{\infty} \frac{\ln^k x}{kn^k k!} \quad [2]$$

and an alternative due to Ramanujan:

$$Li(x) = \gamma + \ln\ln x + \sqrt{x} \sum_{k=1}^{\infty} \frac{(-1)^{k-1} \ln^k x}{k! 2^{k-1}} \sum_{n=0}^{[(k-1)/2]} \frac{1}{2n+1} \quad [3]$$

in which γ is the Euler constant.

Figure 1:
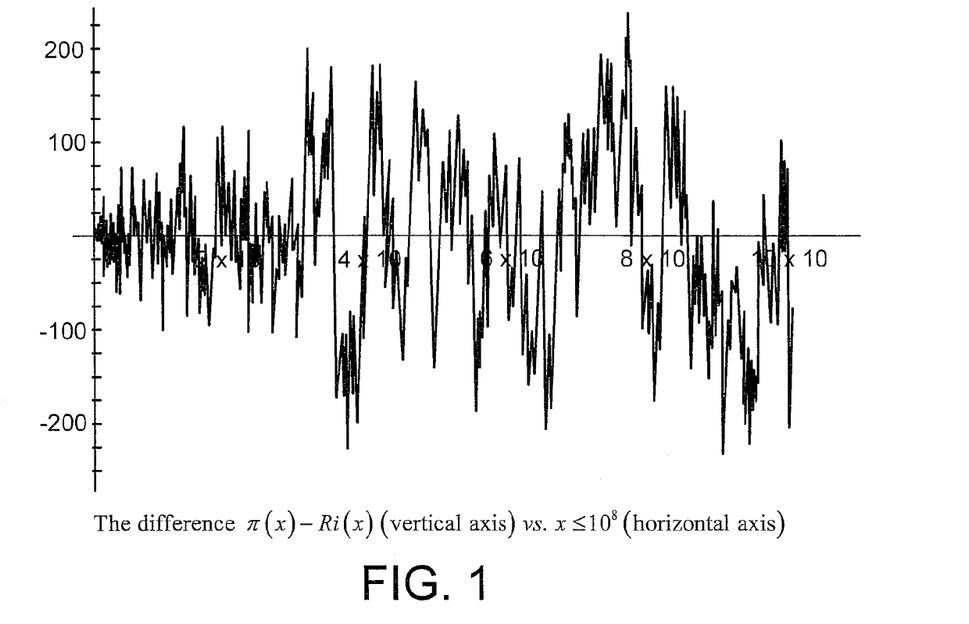
FIG. 1 is a plot illustrating differences (x)–Ri(x) for values of x below $10^8$.

FIG. 1 shows the Ri approximation is over a range such as $x \in [2, 10^8]$. As shown in FIG. 1, the difference π(x)−Ri(x) (vertical axis) vs. $x<=10^8$ (horizontal axis) over a range of arguments x up to 100 million, for example, is correct to within ±1 byte value. This means that a rapid analytic evaluation of Ri provides a value close to π(x).

It is possible to obtain even sharper approximations. For example, one may define $$\pi^*(x) = \pi(x) + \pi(x^{1/2})/2 + \pi(x^{1/3})/3 + \quad [4]$$

and use a proven Riemann-von Mangoldt relationship valid for non-integer x>0:

$$\pi^*(x) = li(x) - \sum_\rho li(x^\rho) - \ln 2 + \int_x^\infty \frac{du}{u(u^2-1)\ln u} \quad [5]$$

in which the summation is over the Riemann critical zeros, and li(x) is the Li integral except with lower integration limit 0. In this context, critical zeros or Riemann zeros refer to complex points s in critical strip 0<Re(s)<1 having z(s)=0. A prime-count estimation may be implied by the Moebius inversion $$\pi(x) = \sum_{n=1}^{\infty} \frac{\mu(n)}{n} \pi^*(x^{1/n}) \quad [6]$$

One may denote by S(x) a partial sum for the right-hand side here, involving some finite number of Riemann zeros, and, thus, forge S(x) as an approximant. As a computational matter, one may interpret li($x^\rho$) as approximately equal to Ei(ρ ln x) where Ei is the exponential integral.

Figure 2:
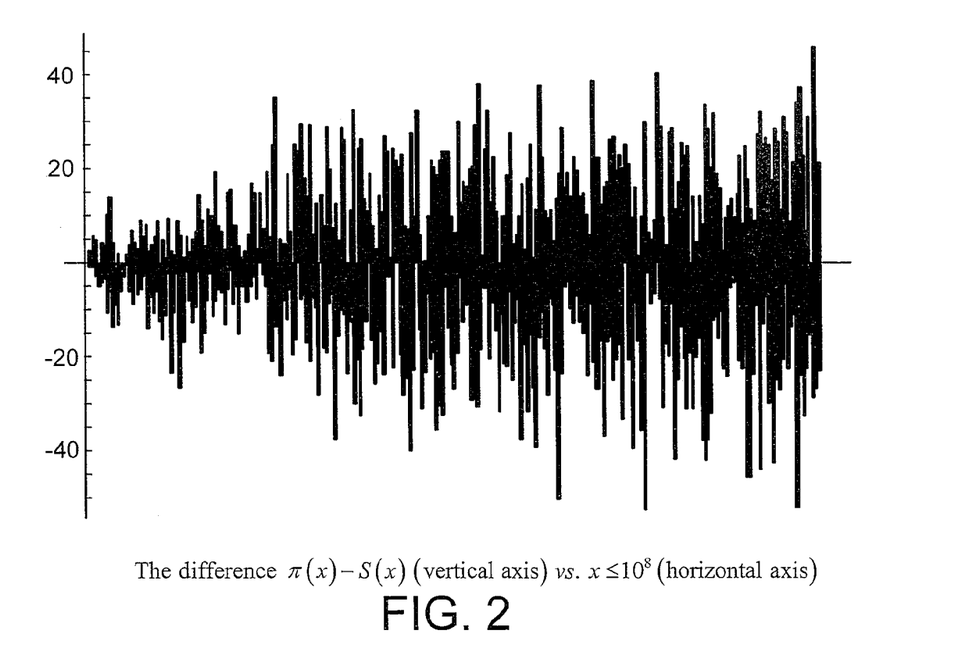
FIG. 2 is a plot illustrating differences (x)–S(x) for values of x below $10^8$.

FIG. 2 shows the Ri approximation accruing from an S approximation with 1000 Riemann critical zeros. FIG. 2 shows the difference π(x)−S(x) (vertical axis) vs. x<=$10^8$ (horizontal axis), in which S is obtained via the first 1000 Riemann critical zeros of positive imaginary part, and the Moebius sums are taken through n=10 terms. The encoding for this range of x is now about 4 bits per desired π(x) value. The essentially Laplacian distribution of S here has an entropy of about 4 bits. These observations lead to another embodiment for fast p( ), n( ) operations for relatively large prime numerals. In this context, the term relatively large prime numeral refers to a numeral q<$2^m$, in which m is large enough to take us beyond a reasonable memory limit if literal storage were employed.

In this particular embodiment, a fast evaluation of A( ):=Ri( ) or A( ):=S( ) or other suitable analytic approximant to π(x) and a pre-stored table of primes numerals P={q<=$2^{m/2}$} is employed.

1) Choose an exponent e, and pre-store checkpoint integers $$\{S_k = \pi(X) - \text{round}(A(x)): x=k\cdot 2^e; k=1, 2, \ldots, 2^{m-e}-1\}.$$

This will involve on the order of $2^{m-e}$ bytes, allowing a reduction in pre-storage.

2) For index function n(q): set k=floor[q/$2^e$]; and sieve the interval (k·$2^e$, (k+1)·$2^e$) to locate q as the i-th prime numeral therein;
3) Return n(q)=$s_k$+round(Ri(k·$2^e$))+i;
4) For the function p(n): find the largest k such that $s_k$+round (Ri(k·$2^e$))<=n; sieve the interval (k·$2^e$, (k+1)·$2^e$); and return p(n) as the ((n−k)·$2^e$)-th prime numeral in the interval.

This particular embodiment allows a reduction of memory with an increase in processing time. Thus, these may be traded off in other embodiments, as desired. For example, the exponent e may be "tuned" to accomplish this for this particular embodiment.

Figure 3:
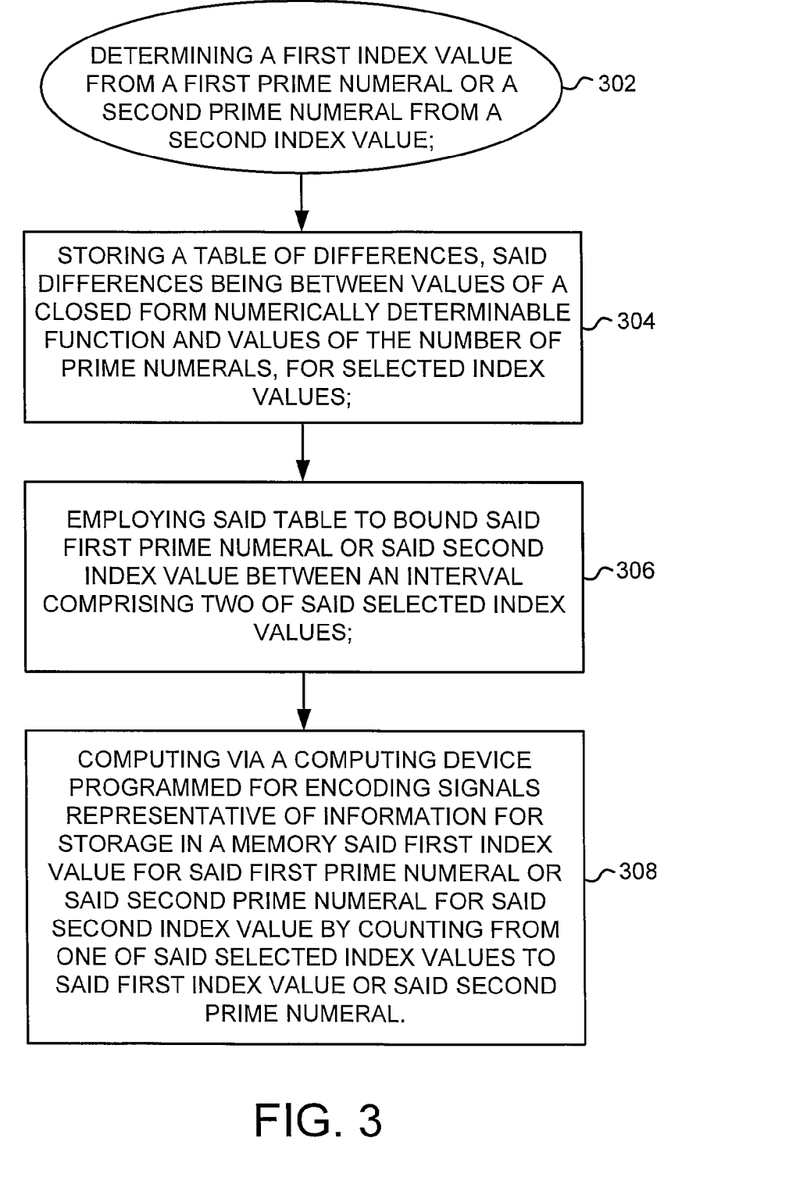
FIG. 3 is a flow diagram illustrating a method for determining index values and/or prime numerals.
Figure 4:
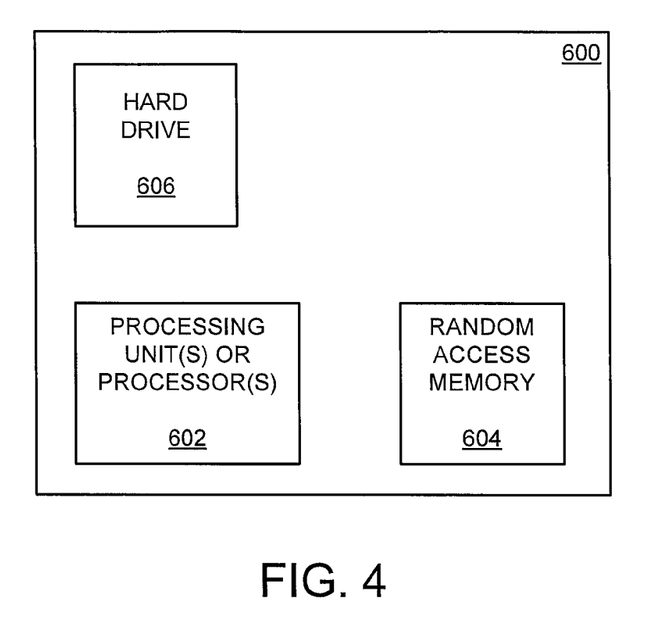
FIG. 4 is a schematic diagram of a computing platform according to an embodiment.
Figure 5:
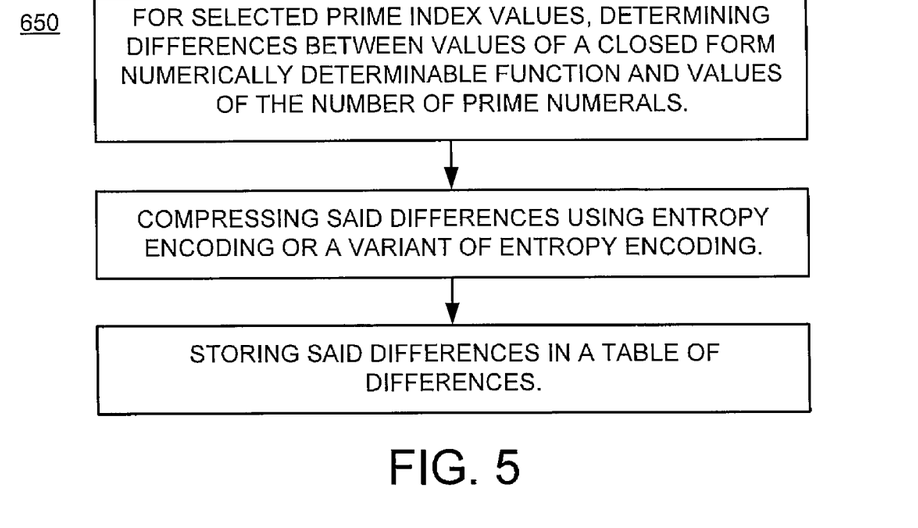
FIG. 5 is a flow diagram illustrating a process for compressing differences in a table according to an embodiment.
Figure 10:
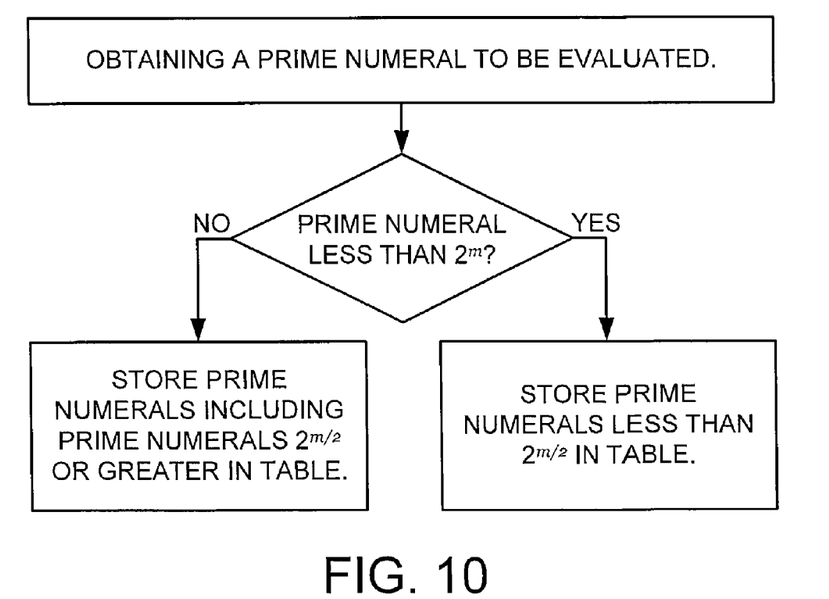
FIG. 10 is a flow diagram illustrating a process to build a table of prime numerals according to an embodiment.

Thus, as illustrated in the flow diagram of FIG. 3, this particular embodiment provides a method of determining the index value for a prime numeral or the prime numeral from an index value at 302. Here, as previously described, a table of stored differences at 304 may be employed. The differences that are stored in this embodiment are differences between a closed form numerically determinable function, here, such as, for example, Li, Ri, S or A, and the number of prime numerals for selected index values. In this context, a numerically determinable function or operation refers to a function in which a value of the function may be determined using a state of the art computing device or computing platform in a period of time that is feasible at least for the purposes of program execution. The table may be employed to bound a particular prime numeral between an interval of two selected index values at 306, for example. The index value for the particular prime numeral may be computed or determined at 308 by counting prime numerals from one of the index values. Although claimed subject matter is not limited in this respect, a numerically determinable function may, of course, include the Riemann function or one or more variants of the Riemann function. For example, the Riemann function evaluated at selected complex zeros may be employed, although claimed subject matter is not limited in scope in this respect. It is likewise noted that, for this embodiment, and as shown in FIG. 10, if a prime numeral is to be evaluated that is less then $2^m$, the table includes prime numerals below the square root of the prime numeral, here, $2^{m/2}$. Thus, the table may omit prime numerals above the square root of the prime numeral.

Figure 6:
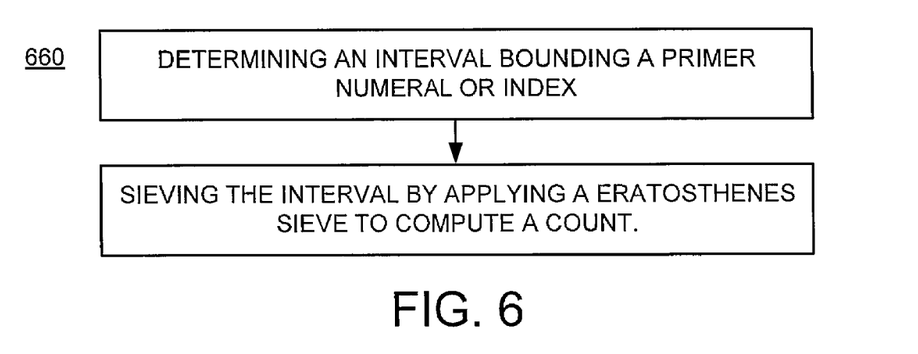
FIGS. 6 through 9 are flow diagrams illustrating processes for applying a sieve to an interval according to alternative embodiments
Figure 7:
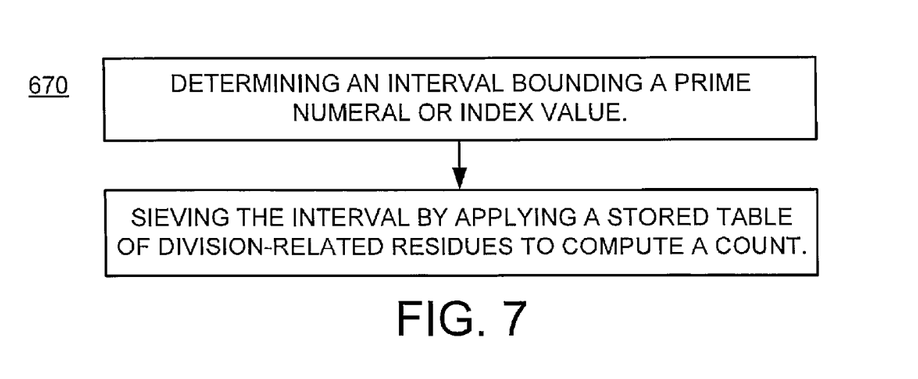
Figure 8:
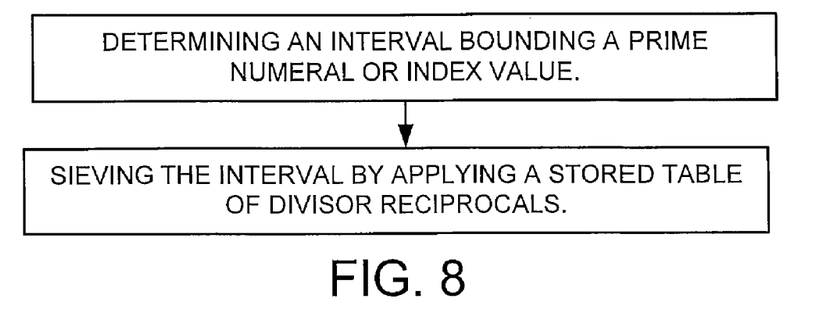
Figure 9:
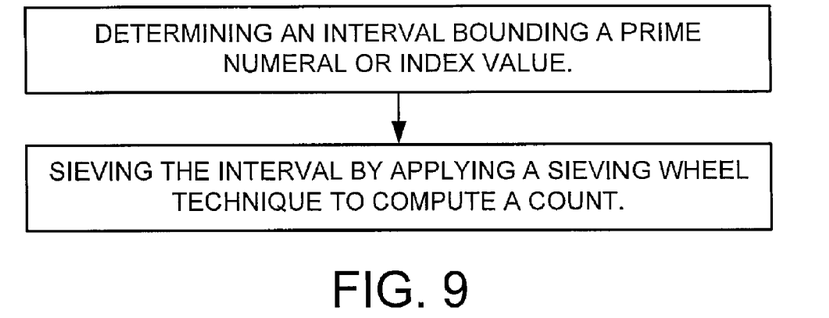

As described in more detail below, the table of differences may be compressed. For example, the compression may include entropy encoding or a variant of entropy encoding, although claimed subject matter is not limited in scope in this respect. In one embodiment, counting may include sieving the interval, although counting is, of course, not limited to sieving. In this context, sieving an interval refers to a process for evaluating numerals in an interval to rule in and/or rule out particular numerals so that, at completion of the process, prime numerals in the interval are identified. Likewise, sieving may include employing an Eratosthenes sieve (as illustrated in FIG. 6), although, again, claimed subject matter is not limited in scope in this respect. Likewise, as described in more detail below, various techniques to enhance processing may be employed, such as, for example, a stored table of division-related residues (as illustrated in FIG. 7), a stored table of divisor reciprocals (as illustrated in FIG. 8), a wheel sieve (as illustrated in FIG. 9) and others. In this context, a divisor reciprocal refers to a value that if used in a multiplication operation is equivalent to dividing a numeral. In this context, a division-related residue refers to a numerical value for a remainder if a first numeral is divided by a second numeral. Of course, claimed subject matter is not limited in scope to employing these techniques. Claimed subject matter also includes employing other techniques that are currently known or to be later developed.

In this particular embodiment or implementation, assume m=50, and e=24, so that about 100 megabytes of pre-storage is employed, yet a sieving procedure employs about 1 second on a 1 GHz platform. Of course, these are merely example values and claimed subject matter is not limited in scope to these. Note also that determining whether a numeral is prime is relatively easy for this particular embodiment. For example, in (2) above, if q is not found after sieving the interval, then q is composite.

Enhancements may be employed to further reduce pre-storage, such as, for $s_k$, in this particular embodiment. One observation is that the differences appear Laplacian distributed around a mean of 0. Furthermore, the Fourier spectrum of typical runs of such differences reveals low-frequency bias. Such observations imply that compression, such as by employing entropy-encoding techniques, for example, may reduce storage. Likewise, one may employ a binary search to locate the interval for sieving to the n-th prime numeral, for example, in (4) above. Some formulae useful in binary searches amongst primes include:

$$1.25506 \frac{n}{\ln n} > \pi(n) > \frac{n}{\ln n}; n > 17,$$

$$n(\ln n + \ln\ln n - 1) < p_n \le n\left(\ln n + \ln\ln n - 1 + 1.8\frac{\ln\ln n}{\ln n}\right); n \ge 13,$$

with the first inequality valid for n>1 and the third inequality for n>2 as well. Note that special inequalities of this kind may be omitted if indexing, rather than locating a prime numeral.

Of course, there are a variety of approaches or ways in which indexing and/or locating a prime numeral may be implemented and claimed subject matter is not limited in scope to particular detailed implementations; however, for the embodiment previously described, there are potential enhancements worth noting here, nonetheless.

For example, it may, in some embodiments, be desirable to implement a "Barrett division less divide. See, for example, Crandall and Pomerance, *Prime Numbers: A Computational Perspective*, Second Edition, Springer-Verlag, New York, 2005. In such a technique, one may avoid or reduce explicit division for primes during sieving, for example; one uses instead a table of stored "steady-state reciprocals" of divisors. Thus, an increase in memory usage may improve processing time.

Likewise, one may make use of a sieving wheel. See, for example, J. Sorenson, "Trading Time for Space in Prime Number Sieves," Lecture Notes in Computer Science, 1423, 179-195, 1998, One choice without limitation includes a 2310-wheel. Likewise, memory segmentation may be employed as part of the sieve, for increasing the effectiveness of the processor cache. See, for example, T. Oliveria e Silva, "Fast Implementation of the Segmented Sieve of Eratosthenes," available at http://www.ieeta.pt/~tos/software/prime_sieve.html. Also, rapid processes exist for finding the square root, which is involved in sieving.

In addition, use of long-long (e.g., 64-bit) machine arithmetic in appropriate ranges may improve processing. For example, using exponent e=24 and a Ri approximant, one may employ about $10^9$ bits of pre-storage, meaning, for example, that storage is about $3 \cdot 10^{-5}$ bits per prime numeral, lower than the previously described explicit-storage methods, for example. Additionally, use of an S approximant may reduce this below 10 micro-bits/prime, with some on-the-fly computation of S. Of course, sieves over intervals of width $2^{24}$ may consume processing time; however, such an embodiment may, for example, reduce real-time for either p( ), n( ) evaluations to about 1 second, such as for primes numerals below $2^{50}$, for example.

There are additional ways to further reduce storage for $s_k$, as in the following embodiment, although, again, claimed subject matter is not limited in scope to these detailed implementation approaches. FIG. 1 shows that Ri(x) provides an approximation for $\pi(X)$ within one byte near $10^8$. This, however, is not the case for $x \leq 2^{50}$, in which, three bytes may be employed for storage of $s_k$. However, these differences may be packed together by storing four $s_k$ values in 8 bytes, on average, as follows. Three bytes may be employed to represent $s_{4k}$. However, 13 bits may be sufficient for recovering $s_{4k+\{1,2,3\}}$. In particular, in one such embodiment, $s_{4k+1}$ is stored as a difference, for example, as $s_{4k+1}$ minus $[(s_{4k}+s_{4k+2})/2]$. Likewise, $s_{4k+2}$ is stored as $s_{4k+}$ minus $[(s_{4k}+s_{4(k+1)})/2]$ and $s_{4k+3}$ is stored as $s_{4k+3}$ minus $[(s_{4k+2}+s_{4(k+1)})/2]$. Note that an S approximation of FIG. 2 should reduce down to a fraction of a byte per $s_k$.

For potential enhancements, in alternative embodiments, Sorenson presents source code fragments for the guts of a basic wheel sieve, as described in the document cited above, for example. An Eratosthenes sieve considers every value on an interval to be sieved; a wheel sieve omits or skips integer numerals which are not relatively prime to the product of the first few primes. Likewise, the document referenced above, has suggested that an Eratosthenes sieve may be implemented using segmentation techniques which enable the lion's share of the sieve's working set to remain in cache for efficient processing. On modern processors, a 2310 wheel provides good results for a non-segmented sieve and wheel sizes of 30 or 210 (the products of the first three and four primes, respectively) provide good results for a segmented wheel sieve. Of course, these are merely examples and claimed subject matter is not limited in scope to these particular embodiments.

It will, of course, be understood that, although particular embodiments have just been described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive. It is worth noting that embodiments of claimed subject matter may be employed in a variety of contexts. For example, without limitation, in one embodiment, a software application may have the capability to perform described operations. Of course, claimed subject matter is not limited in scope to such examples or embodiments. Thus, claimed subject matter is not limited to implementation in software applications. Again, as previously indicated, many other approaches to software, firmware and/or hardware are included within the scope of claimed subject matter.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of determining a first index value from a first prime numeral or a second prime numeral from a second index value, said method comprising: storing a table of differences, said differences being between values of a closed form numerically determinable function and values of the number of prime numerals, for selected index values; employing said table to bound said first prime numeral or said second index value between an interval comprising two of said selected index values; and computing said first index value for said first prime numeral or said second prime numeral for said second index value by counting from one of said selected index values to said first index value or said second prime numeral.

2. The method of claim 1, wherein said method is implemented for relatively large prime numerals.

3. The method of claim 1, wherein said closed form numerically determinable function comprises the Riemann function or one or more variants of the Riemann function.

4. The method of claim 3, wherein said numerically determinable function comprises said one or more variants, said one or more variants comprising the Riemann function evaluated at selected complex zeros.

5. The method of claim 1, and further including storing a table of prime numerals.

6. The method of claim 5, wherein, if prime numerals to be evaluated are below $2^m$ in magnitude, the table of prime numerals includes prime numerals below $2^{m/2}$.

7. The method of claim 5, wherein said table includes no prime numerals above $2^{m/2}$.

8. The method of claim 1, wherein the table of differences is compressed.

9. The method of claim 8, wherein the compression comprises entropy encoding or a variant of entropy encoding.

10. The method of claim 1, wherein said counting includes sieving the interval.

11. The method of claim 10, wherein said sieving comprises Eratosthenes sieving.

12. The method of claim 10, wherein said sieving employs a stored table of division-related residues.

13. The method of claim 10, wherein said sieving employs a stored table of divisor reciprocals.

14. The method of claim 10, wherein said sieving employs a sieving wheel technique.

15. An article comprising: a storage medium having stored thereon instructions that if executed result in performance of a method of determining a first index value from a first prime numeral or a second prime numeral from a second index value as follows: storing a table of differences, said differences being between values of a closed form numerically determinable function and values of the number of prime numerals, for selected index values; employing said table to bound said first prime numeral or said second index value between an interval comprising two of said selected index values; and computing said first index value for said first prime numeral or said second prime numeral for said second index value by counting from one of said selected index values to said first index value or said second prime numeral.

16. The article of claim 15, wherein said instructions if executed further result in: said method being implemented for relatively large prime numerals.

17. The article of claim 15, wherein said instructions if executed further result in: said closed form numerically determinable function comprising the Riemann function or one or more variants of the Riemann function.

18. The article of claim 17, wherein said instructions if executed further result in: said determinable function comprising said one or more variants, said one or more variants comprising the Riemann function evaluated at selected complex zeros.

19. The article of claim 15, and further including stored a table of prime numerals.

20. The article of claim 19, wherein said instructions if executed further result in: if prime numerals to be evaluated are below $2^m$ in magnitude, the table of prime numerals including prime numerals below $2^{m/2}$.

21. The article of claim 19, wherein said instructions if executed further result in: said table including no prime numerals above $2^{m/2}$.

22. The article of claim 15, wherein t said instructions if executed further result in: he table of differences being compressed.

23. The article of claim 22, wherein said instructions if executed further result in: the compression comprising entropy encoding or a variant of entropy encoding.

24. The article of claim 15, wherein said instructions if executed further result in: said counting including sieving the interval.

25. The article of claim 24, wherein said instructions if executed further result in: said sieving comprising Eratosthenes sieving.

26. The article of claim 24, wherein said instructions if executed further result in: said sieving employing a stored table of division-related residues.

27. The article of claim 24, wherein said instructions if executed further result in: said sieving employing a stored table of divisor reciprocals.

28. The article of claim 24, wherein said instructions if executed further result in: said sieving employing a sieving wheel technique.

29. An apparatus comprising: means for storing a table of differences, said differences being between values of a closed form numerically determinable function and values of the number of prime numerals, for selected index values; means for employing said table to bound said first prime numeral or said second index value between an interval comprising two of said selected index values; and means for computing said first index value for said first prime numeral or said second prime numeral for said second index value by counting from one of said selected index values to said first index value or said second prime numeral.

30. The apparatus of claim 29, wherein said apparatus is capable of being implemented for relatively large prime numerals.

31. The apparatus of claim 29, wherein said closed form numerically determinable function comprises the Riemann function or one or more variants of the Riemann function.

32. The apparatus of claim 31, wherein said determinable function comprises said one or more variants, said one or more variants comprising the Riemann function evaluated at or capable of being evaluated at selected complex zeros.

33. The apparatus of claim 29, and further including a stored table of prime numerals.

34. The apparatus of claim 33, wherein, if prime numerals to be evaluated by said apparatus are below $2^m$ in magnitude, the table of prime numerals includes prime numerals below $2^{m/2}$.

35. The apparatus of claim 33, wherein said table includes no prime numerals above $2^{m/2}$.

36. The apparatus of claim 29, wherein the table of differences is compressed.

37. The apparatus of claim 36, wherein the compression employed comprises entropy encoding or a variant of entropy encoding.

38. The apparatus of claim 29, wherein said means for counting includes means for sieving the interval.

39. The apparatus of claim 38, wherein said means for sieving comprises means for Eratosthenes sieving.

40. The apparatus of claim 38, wherein said means for sieving includes a stored table of division-related residues.

41. The apparatus of claim 38, wherein said means for sieving includes a stored table of divisor reciprocals.

42. The apparatus of claim 38, wherein said means sieving includes means for wheel sieving.

43. An apparatus comprising: a computing platform; said computing platform being adapted to store a table of differences, said differences being between values of a closed form numerically determinable function and values of the number of prime numerals, for selected index values, to employ said table to bound said first prime numeral or said second index value between an interval comprising two of said selected index values, and to compute said first index value for said first prime numeral or said second prime numeral for said second index value by counting from one of said selected index values to said first index value or said second prime numeral.

44. The apparatus of claim 43, wherein said computing platform is capable of being implemented for computations for relatively large prime numerals.

45. The apparatus of claim 43, wherein said closed form numerically determinable function comprises the Riemann function or one or more variants of the Riemann function.

46. The apparatus of claim 45, wherein said determinable function comprises said one or more variants, said one or more variants comprising the Riemann function evaluated at or capable of being evaluated at selected complex zeros.

47. The apparatus of claim 43, and further including a stored table of prime numerals.

48. The apparatus of claim 47, wherein, if prime numerals to be evaluated are below $2^m$ in magnitude, the table of prime numerals includes prime numerals below $2^{m/2}$.

49. The apparatus of claim 47, wherein said table includes no prime numerals above $2^{m/2}$.

50. The apparatus of claim 43, wherein the table of differences is compressed.

51. The apparatus of claim 50, wherein the compression employed comprises entropy encoding or a variant of entropy encoding.

52. The apparatus of claim 43, wherein said computing platform is adapted so that said counting is capable of including sieving the interval.

53. The apparatus of claim 52, wherein said computing platform is adapted so that said sieving is capable of including Eratosthenes sieving.

54. The apparatus of claim 52, wherein said computing platform is adapted so that sieving is capable of employing a stored table of division-related residues.

55. The apparatus of claim 52, wherein said computing platform is adapted so that said sieving is capable of employing a stored table of divisor reciprocals.

56. The apparatus of claim 52, wherein said computing platform is adapted so that said sieving is capable of employing a sieving wheel technique.

57. A method of processing one or more electronic signals, said method comprising: determining, on a computing platform executing at least one particular software application, said one or more electronic signals as follows: storing a table of differences, said differences being between values of a closed form numerically determinable function and values of the number of prime numerals, for selected index values; employing said table to bound a first prime numeral or a second index value between an interval comprising two of said selected index values; and computing a first index value for said first prime numeral or a second prime numeral for said second index value by electronically counting from one of said selected index values to said first index value or said second prime numeral;

wherein said values, including said prime numerals, are respectively represented on said computing platform by one or more electronic signal values.

58. The method of claim 57, wherein said one or more electronic signal values are determined for a relatively large prime numeral.

59. The methods of claim 57, wherein said closed form numerically determinable function comprises the Riemann function or one or more variants of the Riemann function.

60. The method of claim 59, wherein said numerically determinable function comprises said one or more variants, said one or more variants comprising the Riemann function evaluated at selected complex zeros.

61. The method of claim 57, wherein said one or more electronic signal values having further been determined using a table of prime numerals.

62. The methods of claim 61, wherein, if prime numerals to be evaluated are below $2^m$ in magnitude, the table of prime numerals includes prime numerals below $2^{m/2}$.

63. The methods of claim 61, wherein said table includes no prime numerals above $2^{m/2}$.

64. The signal of claim 57, wherein the table of differences is compressed.

65. The methods of claim 64, wherein the compression comprises entropy encoding or a variant of entropy encoding.

66. The method of claim 57, wherein said one or more electronic signal values having been determined by said electronically counting including sieving the interval.

67. The method of claim 66, wherein said one or more electronic signal values having been determined by said sieving comprises Eratosthenes sieving.

68. The method of claim 66, wherein said one or more electronic signal values having been determined by employing a stored table of division-related residues.

69. The method of claim 66, wherein said one or more electronic signal values having been determined by employing a stored table of divisor reciprocals.

70. The method of claim 66, wherein said one or more electronic signal values having been determined by employing a sieving wheel technique.

* * * * *